United States Patent [19]

Avery

[11] 4,400,711

[45] Aug. 23, 1983

[54] INTEGRATED CIRCUIT PROTECTION DEVICE

[75] Inventor: Leslie R. Avery, Flemington, N.J.

[73] Assignee: RCA Corporation, New York, N.Y.

[21] Appl. No.: 249,612

[22] Filed: Mar. 31, 1981

[51] Int. Cl.³ .......................................... H01L 27/02
[52] U.S. Cl. ..................................... 357/43; 357/46; 357/38; 357/48; 361/56
[58] Field of Search ................... 357/43, 46, 38 T, 38, 357/48; 361/56

[56] References Cited

U.S. PATENT DOCUMENTS

| 3,401,319 | 9/1968 | Watkins | 357/43 |
| 4,001,868 | 1/1977 | Liang | 357/38 |

FOREIGN PATENT DOCUMENTS

| 14435 | 3/1980 | European Pat. Off. | |
| 2951421 | 9/1980 | Fed. Rep. of Germany | 357/48 |
| 1094336 | 4/1965 | United Kingdom | |
| 1119297 | 11/1966 | United Kingdom | |
| 1367325 | 9/1971 | United Kingdom | |
| 1396896 | 9/1972 | United Kingdom | 357/43 |
| 1585790 | 7/1977 | United Kingdom | |
| 2070370 | 12/1980 | United Kingdom | |

Primary Examiner—Martin H. Edlow
Assistant Examiner—Jerome Jackson, Jr.
Attorney, Agent, or Firm—Birgit E. Morris; Donald S. Cohen; Lawrence P. Benjamin

[57] ABSTRACT

Disclosed is a protection circuit which may be used, for example, in a television receiver to protect circuitry formed within an integrated circuit from damage due to excessively high voltage transients. The protection circuit comprises a PNPN structure forming a silicon controlled rectifier (SCR) and metal-oxide-semiconductor (MOS) transistor integral to the SCR structure. The SCR and the MOS transistors are arranged to form a two terminal protection circuit which is rendered conductive when the potential difference across the two terminals is greater than a predetermined threshold. One terminal of the protection circuit is connected to an input or output signal terminal of the protected circuit, and the other terminal is connected to a reference terminal to which a reference potential such as ground potential is applied. Transient voltages appearing at the integrated circuit terminal greater than the predetermined threshold voltage causes the protection circuit to conduct current, thereby dissipating the energy of the high voltage transient and protecting the integrated circuit from damage. In one embodiment, the gate electrode of the MOS transistor is connected to the reference terminal, and in another to the signal terminal. The latter connection provides a much larger predetermined threshold than the former, and typically considerably in excess of the supply voltage.

12 Claims, 6 Drawing Figures

INTEGRATED CIRCUIT PROTECTION DEVICE

FIELD OF THE INVENTION

This invention relates to integrated circuit protection devices.

BACKGROUND OF THE INVENTION

Many types of electrical equipment contain IC (integrated circuit) devices which are vulnerable to damage from high voltage transients.

In a television receiver the anode of the image producing kinescope is typically biased at a high potential, e.g., 25,000 volts. High voltage transients may be produced when the high voltage anode of the kinescope is rapidly discharged to points at lower potentials. Such high voltage transients have positive and negative peaks often in excess of 100 volts and may last several microseconds. High voltage transients may also be produced when electrostatic charges are discharged as a user contacts the controls of the television receiver. High voltage transients may be coupled to the terminals of IC's employed in the television receiver for video and audio signal processing. Accordingly, these IC's may be damaged by high voltage transients.

Copending patent application entitled "Protection Circuit for Integrated Circuit Devices," Ser. No. 212,534, filed in the name of the present inventor Dec. 3, 1980 and assigned to RCA Corporation, discloses a protection device for protecting an IC from negative voltage transients that exceed the most negative power supply potential applied to the IC. Another copending patent application entitled "Protection Circuit for Integrated Circuit Devices," Ser. No. 230,357 filed also in the name of the present inventor Jan. 30, 1981, and also assigned to RCA Corporation, discloses a protection circuit which is triggered at one forward biased diode voltage drop above the positive supply voltage for protecting an IC from positive voltage transients that exceed the most positive power supply potential applied to the IC.

However, in a television receiver, particular signals applied to an IC may have positive voltage excursions which in normal operation exceed the positive supply potential. For example, a typical television horizontal/-vertical regulator IC requires a feedback connection from the kinescope deflection coils to one of its input terminals. While the power supply for the IC is typically +10 volts, the peak feedback voltage from the deflection coils is typically +27 volts. Therefore, it is desirable to provide a positive transient protection circuit for such IC's that permits normal signal voltages to exceed the power supply potential without activating such protection circuit and nevertheless protects the IC from excessively large transients.

SUMMARY OF THE INVENTION

The present invention is embodied in an integrated circuit protection device comprising a pair of complementary conductivity transistors and a metal oxide semiconductor (MOS) transistor formed integral to the semiconductor structure. The pair of complementary conductivity transistors and the MOS transistors are arranged to form a two-terminal device capable of conducting a high current when the potential difference across its two terminals exceeds a predetermined threshold. The protection device is connected at one terminal thereof to a circuit terminal of the circuit to be protected and at the other terminal thereof to a source of reference potential. When the potential at the circuit terminal of the protected circuit exceeds the predetermined threshold, which is preferably set above the maximum expected signal voltage, the protection circuit is rendered conductive, thereby protecting the IC from damage.

In one embodiment, the gate electrode of the MOS transistor is connected to the source of reference potential, so that the predetermined threshold of the protection device is substantially equal to the threshold of the MOS transistor. In a second embodiment, the gate electrode of the MOS transistor is connected to the circuit terminal of the circuit to be protected so that the MOS transistor is conditioned for nonconduction. The predetermined threshold of the latter protection device is considerably greater than that of the former.

DETAILED DESCRIPTION

Figure 1:
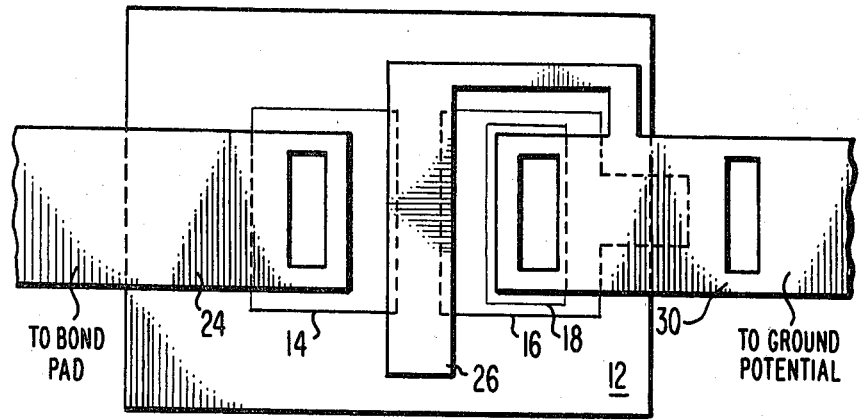
FIG. 1 is a plan view of an integrated circuit protection device in accordance with an embodiment of the present invention.
Figure 2:
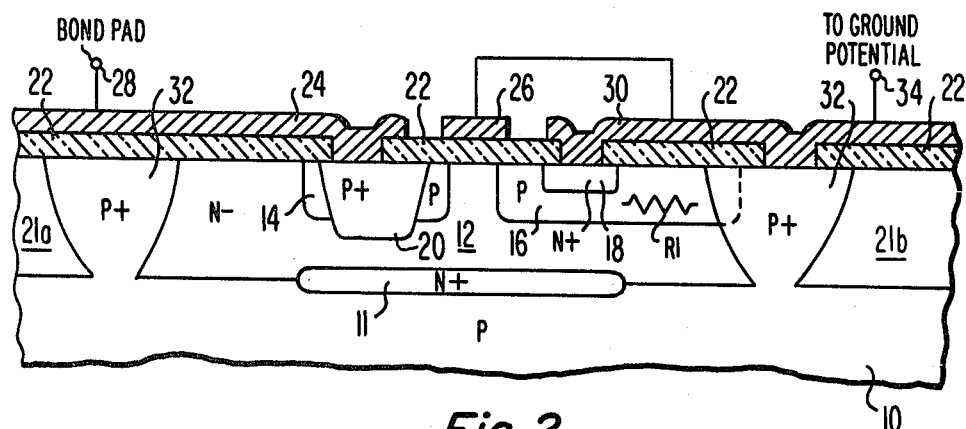
FIG. 2 is a cross sectional view of a semiconductor structure illustrating further structural details of the protection device of FIG. 1.
Figure 3:
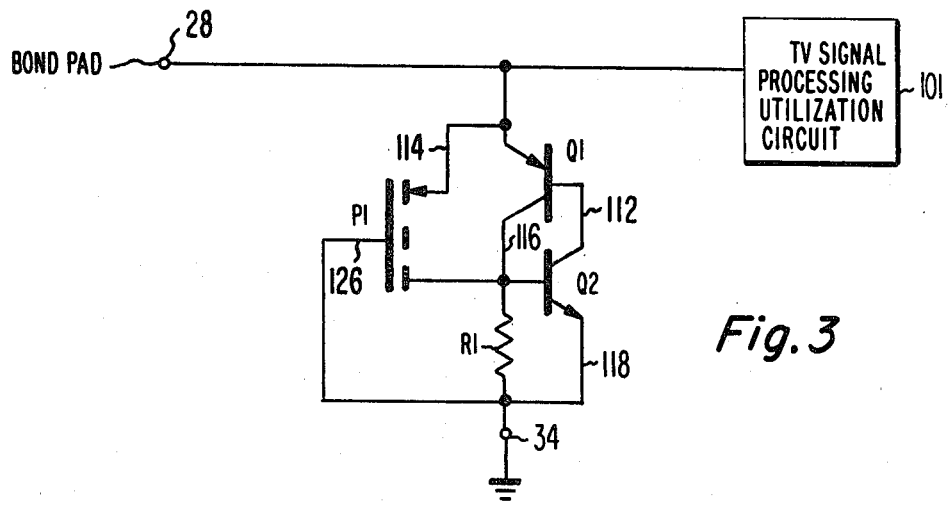
FIG. 3 is a schematic diagram of the semiconductor protection device in FIGS. 1 and 2.

As shown in FIGS. 1 and 2, a semiconductor circuit is fabricated on a substrate 10 made of P type silicon material. An epitaxial layer 12 of N− type conductivity is disposed on the substrate 10. A P region 14 is disposed within N− epitaxial layer 12, forming a PN junction with layer 12. A P+ region 20 is further formed within P region 14. Another P region 16 is disposed within N− epitaxial layer 12, forming a PN junction with epitaxial layer 12. An N+ region 18 is disposed within P region 16 forming a PN junction with P region 16. A buried N+ region 11 underlies rgions 14, 20, 16 and 18. The structure thus formed within N− epitaxial layer 12 is a protection circuit, the schematic for which is shown in FIG. 3. A P+ region 32 surrounds N− epitaxial layer 12 and extends from the surface of epitaxial layer 12 to the substrate 10 thereby isolating the protection circuit formed within N− epitaxial layer 12 from other circuits on the substrate 10 in regions 21a and 21b. The P+ region 32 also overlaps P region 16 to provide a connection between the substrate 10 and P region 16.

An insulating layer 22, which may for example be silicon dioxide, overlies the surface of N− epitaxial layer 12. Openings are formed in the insulating layer 22 over regions 20, 18 and 32 in order to make respective electrical contact thereto. A conductive layer 24, which may for example be aluminum, overlies the insulting layer 22 and makes contact with P+ region 20. Another conductive layer 30 overlies the insulating layer 22 and makes contact with N+ region 18 and P+ region 32. A further conductive layer 26, which is connected to conductive layer 30, overlies that portion of N− epitaxial layer 12 extending between P region 14 and P region 16 so as to form a P channel MOS transistor.

A bond pad 28 is connected to P+ region 20 through conductive layer 24. The bond pad 28 is further connected to a signal terminal of utilization circuit 101 elsewhere on the IC such as in regions 21a and 21b. A terminal 34 is further connected to P region 32 and N+ region 18 through conductive layer 30. Terminal 34 is connected to receive a source of reference potential, such as ground potential.

FIG. 3 is a schematic circuit model of the structure illustrated in FIGS. 1 and 2. The protection circuit comprises a PNP transistor Q1, an NPN transistor Q2, a P channel MOS transistor P1, and a resistor R1. The emitter electrode 114, base electrode 112 and collector electrode 116 of transistor Q1 correspond to regions 14, 12 and 16, respectively in FIGS. 1 and 2. P+ region 20 increases the injection efficiency of the emitter region 14 of transistor Q1 which increases the common emitter forward current gain commonly referred to as "beta" of that transistor. The emitter electrode 118, base electrode 116 and collector electrode 112 of transistor Q2 corresponds to regions 18, 16 and 12, respectively in FIGS. 1 and 2. Source electrode 114 and drain electrode 116 of transistor P1 correspond to regions 14 and 16, respectively, in FIGS. 1 and 2. The gate electrode 126 of transistor P1 corresponds to conductor 26 in FIGS. 1 and 2. Resistor R1 corresponds to the extended portion of P region 16 between N+ region 18 and P+ region 32 plus the pinch resistor formed by that portion of P region 16 that underlies N+ region 18.

The value of resistor R1 is determined by the resistivity of the P region 16, and the geometry of N+ region 18 relative to P region 16 (see FIG. 2). For example, the resistance of resistor R1 may be increased by further extending P region 16 further away from N+ region 18 or making the extension narrower. Also, as is known to those skilled in the art, the value of resistor R1 attributable to the pinch resistor beneath N+ region 18 may be increased by diffusing N+ region 18 deeper into P region 16. The buried N+ region 11 provides increased conductivity across the lower region of epitaxial layer 12 which increases the ability of transistors Q1 and Q2 to conduct current when a high voltage transient has triggered the protection device.

As shown in FIG. 3 transistors Q1 and Q2 are connected to form a silicon control rectifier (SCR). Specifically, the base electrode of Q1 is connected to the collector electrode of Q2 and the base electrode of Q2 is connected to the collector electrode of Q1. Resistor R1 is connected between the base and emitter electrodes of transistor Q2. The source electrode of transistor P1 is connected to the emitter electrode of transistor Q1 and the drain electrode of transistor P1 is connected to the collector electrode of transistor Q1 so that the conduction channel of P1 is connected in parallel with the main conduction path of transistor Q1. Gate electrode 126 of transistor P1 is connected to the emitter electrode of transistor Q2. The resulting protection device is connected between bond pad 28, which is a signal terminal (either for input or output signals) of a TV utilization circuit 101 to be protected and terminal 34, which is connected to ground potential.

The present structure differs from a conventional SCR device in that the integral MOS transistor and its connections to transistors Q1 and Q2 converts the three-terminal SCR devices into a two-terminal device that is rendered conductive when the voltage across its terminals exceeds a predetermined threshold. Since the gate and source electrodes are connected between signal terminal 28 and ground terminal 34, the predetermined threshold of the protection device is substantially equal to the gate-to-source threshold voltage of transistor P1, i.e., the gate voltage at which transistor P1 conducts.

In operation, assume that transistors Q1 and Q2 are initially non-conductive. Resistor R1 prevents electrical and thermal noise from inadvertently causing transistors Q1 and Q2 to conduct. So long as the signal applied to bond pad 28 has a potential below the gate-to-source threshold voltage of transistor P1, transistors Q1 and Q2 remain non-conductive.

A high voltage transient appearing at bond pad 28 having a potential greater than the gate-to-source threshold voltage of P1 causes the gate to source voltage of transistor P1 to exceed the threshold voltage of P1, which causes channel current to flow in transistor P1. Conduction by transistor P1 provides base current to transistor Q2. The resulting collector current of transistor Q2 provides base current to transistor Q1, causing that transistor to conduct. The conduction between collector and emitter electrodes of transistors Q1 and Q2 is regenerative, thereby driving transistors Q1 and Q2 into high conduction. The energy of the high voltage transient is diverted by virtue of the conduction of transistors Q1 and Q2 to ground, thereby protecting the TV signal processing utilization circuit 101 from damage.

When the current supplied by the high voltage transient from bond pad 28 to power supply terminal 34 falls below a minimum sustaining current, transistor Q2 is provided with insufficient base to remain conductive, and therefore Q2 turns off. In response, the base current to transistor Q1 is removed, causing Q1 to turn off. Accordingly, the protection circuit becomes nonconductive. Resistor R1, in addition to stabilizing the protection device against inadvertent firing, also determines the minimum holding current below which Q1 and Q2 become nonconductive. As the value of resistor R1 is increased, the minimum holding current is decreased, and vice versa.

The predetermined threshold voltage of the protection device is substantially equal to the threshold voltage of transistor P1. As is known in the art, the threshold voltage of an MOS transistor is related to the oxide thickness beneath the gate electrode thereof and the conductivity of the channel material. Typical values for the threshold voltage of MOS transistors such as P1 are in the range between 20 and 30 volts. Accordingly, by appropriate design of MOS transistor P1, the predetermined threshold of the protection circuit can be set at a relatively high value, e.g. 30 volts which is typically much higher than the most positive power supply voltage, e.g. 10 volts.

Figure 4:
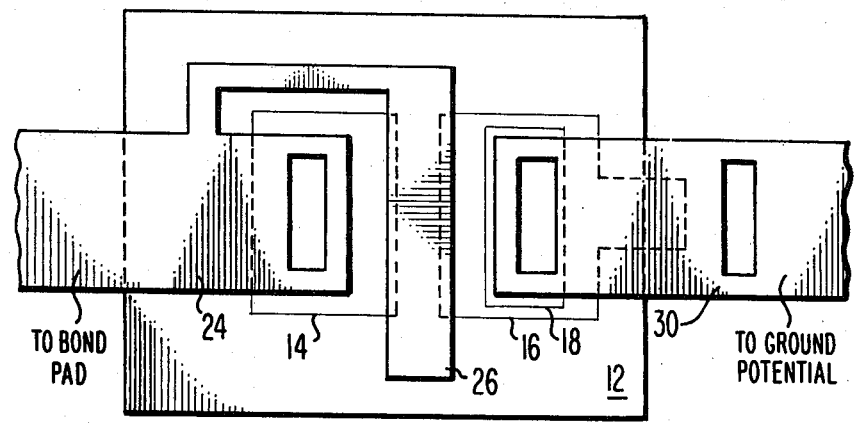
FIG. 4 is a plan view of an integrated circuit protection device in accordance with an alternate embodiment of the present invention.
Figure 5:
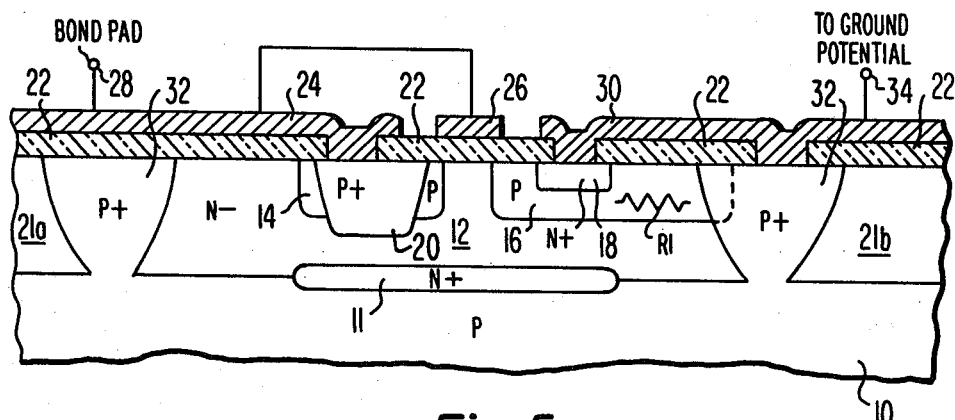
FIG. 5 is a cross sectional view of a semiconductor structure illustrating further structural details of the protection device of FIG. 4.
Figure 6:
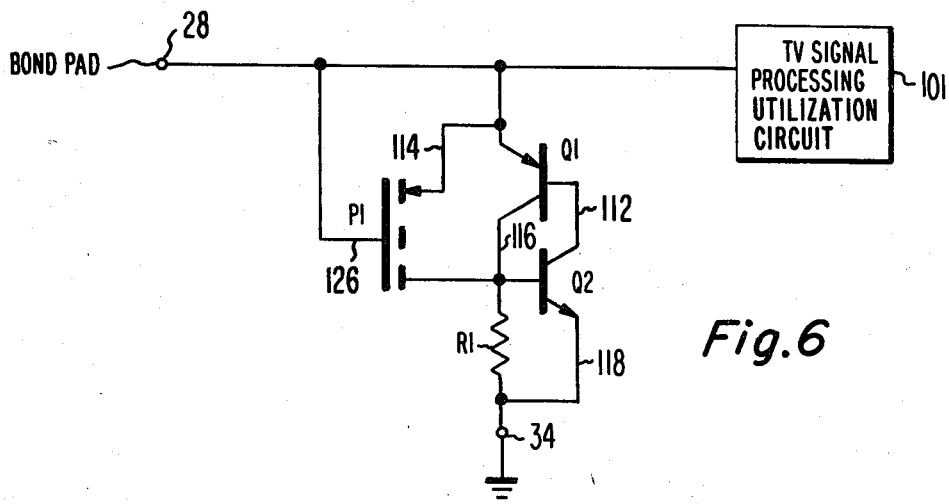
FIG. 6 is a schematic diagram of the semiconductor protection device of FIGS. 4 and 5.

An alternate embodiment of the present invention wherein the predetermined threshold voltage of the protection device is substantially increased compared with that of the protection device shown in FIGS. 1, 2 and 3 is shown in FIGS. 4, 5 and 6. The structure of the protection circuit of FIGS. 4, 5 and 6 is the same as that shown in FIGS. 1, 2 and 3 except that the gate electrode of transistor P1 is not connected to ground potential as in the first embodiment, but rather to the bond pad 28 via a connection between conductive layer 26 and conductive layer 24. Such connection between the gate and source electrodes of transistor P1 conditions that transistor to be nonconductive for all positive voltages at bond pad 28. In this embodiment, the predetermined threshold voltage of the protection device depends on the reverse bias breakdown voltage between collector and base electrodes of transistors Q1 and Q2 rather than on the threshold voltage of transistor P1. The collector to base reverse bias breakdown voltage is that voltage applied to the collector which causes base current to be applied from the collector. As long as the collector to base current is not excessive, the transistor conducts, but no damage occurs to the transistor. The purpose of transistor P1 is to increase the reverse bias breakdown voltage of transistors Q1 and Q2. Towards this end, it is believed that the electric field induced beneath the gate electrode of transistor P1 tends to inhibit the collector to base breakdown of transistors Q1 and Q2 from occurring near the surface of the integrated circuit. As a result, the collector to base breakdown phenomena tends to occur at a greater depth into the semiconductor wafer, which has the effect of increasing the collector to base breakdown voltage. Thus, connecting the gate electrode of transistor P1 to bond pad 28 where it receives the positive transient increases the predetermined threshold voltage of the SCR formed by transistors Q1 and Q2.

The reverse bias breakdown occurs at the junction of regions 12 and 16. Therefore, the predetermined threshold voltage of the protection device is substantially equal to the reverse bias collector to base breakdown voltage of transistor Q2.

The breakdown voltage of transistor Q2 is, to some extent, determined by the value of resistor R1. In particular, as the value of resistor R1 is decreased, the reverse bias collector to base breakdown voltage of transistor Q2 is increased, and vice versa. Also, the reverse bias breakdown voltage of transistor Q2 is affected by particular parameters of transistor P1. For example, the thinner the oxide insulator beneath the gate electrode 26 of transistor P1, the deeper the respective collector to base breakdown occurs resulting in potentially higher breakdown voltages. Breakdown voltages in the range of 40 to 60 volts are obtainable.

In operation, a signal is applied at bond pad 28, and transistors Q1 and Q2 are initially nonconductive. A high voltage transient appearing at bond pad 28 will cause the potential at bond pad 28 to rise sharply. Such positive potential substantially appears across the collector to base junction of transistors Q1 and Q2. When the potential applied exceeds the reverse bias breakdown of transistor Q2, base current is provided to transistor Q1 which in turn supplies base current to transistor Q2 regeneratively driving both transistors into high conduction.

When the current supplied by the high voltage transient from bond pad 28 to power supply terminal 34 falls below the minimum holding current, transistors Q1 and Q2 will turn off and the protection circuit becomes nonconductive. In such manner, the energy of high voltage transients producing a positive voltage at bond pad 28 in excess of the threshold voltage of the protection circuit is dissipated by the conduction of transistors Q1 and Q2 to power supply terminal 34. Furthermore, since the predetermined threshold voltage of the protection device is 40 volts or more, the input signal variation may considerably exceed the positive power supply potential typically in the order of +10 volts without triggering the protection device.

While the present invention has been described with reference to a specific structure it will be understood that modification within the scope of the invention as defined in the following claims are contemplated. For example, P and N type semiconductor regions may be interchanged to provide a protection device that is rendered conductive for negative voltage transients. Also, it is to be understood that conductive layer 26 which forms the gate electrode of MOS transistor P1 may be a conductor other than aluminum and the insulating material beneath the gate may be an insulator other than silicon dioxide.

What is claimed is:

1. A semiconductor protection circuit comprising:
   a semiconductor substrate of a first conductivity type;
   a semiconductor layer of a second conductivity type disclosed on said substrate, said semiconductor layer having a surface;
   first and second semiconductor regions of said first conductivity type, each disposed in PN junction forming relation with said semiconductor layer;
   a third semiconductor region of said second conductivity type disposed in PN junction forming relation with said second semiconductor region;
   a layer of insulating material disposed on the surface of said semiconductor layer lying between said first and second semiconductor regions;
   a layer of conductive material disposed on said insulating layer; and
   conductive means for connecting said conductive layer to one of said first and third semiconductor regions.

2. A semiconductor protection circuit in accordance with claim 1 wherein said conductive means connects said conductive layer to said first semiconductor region.

3. A semiconductor protection circuit in accordance with claim 1 wherein said conductive means connects said conductive layer to said third semiconductor region.

4. A semiconductor protection circuit in accordance with claim 1, 2 or 3 wherein:
   said second semiconductor region extends in a direction along the surface of said semiconductor layer so as to form a resistor comprising that portion of said second semiconductor region disposed between said third semiconductor region and the end of said extension of said second semiconductor region.

5. A semiconductor protection circuit in accordance with claim 4 further comprising means for connecting said extended end of said second semiconductor region to said semiconductor substrate.

6. A semiconductor protection circuit according to claim 5 wherein said means for connecting said extended end of said second semiconductor region to said semiconductor substrate comprises a fourth semiconductor region of said first conductivity type extending from said surface of said semiconductor layer to said substrate, said fourth semiconductor region intersecting with said second semiconductor region at said extended end thereof, said fourth semiconductor region surrounding said semiconductor layer.

7. A semiconductor protection circuit in accordance with claim 5 further comprising:
   a reference terminal for receiving a reference supply potential;
   means for connecting said reference terminal to said substrate and to said third semiconductor region;

a bond pad;

a utilization circuit including a terminal for receiving a signal, said terminal being connected to said bond pad; and means for connecting said bond pad to said first semiconductor region.

8. A semiconductor protection circuit in accordance with claim 4 further comprising a buried semiconductor region of said second conductivity type, said buried semiconductor region disposed between said semiconductor layer and said substrate, and extending beneath said first semiconductor region, said third semiconductor region, and that portion of said semiconductor layer between said first and said third semiconductor regions, said buried semiconductor region having a lower resistivity than that of said semiconductor layer.

9. A protection circuit comprising:

first and second transistors of opposite conductivity type having respective emitter, base, and collector electrodes;

an MOS transistor having source, gate, and drain electrodes;

a signal terminal to which the source electrode of said MOS transistor and the emitter electrode of said first transistor are connected;

a connection between the base electrode of said first transistor and the collector electrode of said second transistor;

a common connection between the collector electrode of said first transistor, the base electrode of said second transistor and the drain electrode of the MOS transistor;

a resistor connected between the base and emitter electrodes of said second transistor;

a reference terminal to which the emitter electrode of said second transistor is connected; and a connection between the gate electrode of said MOS transistor to one of said signal and reference terminals.

10. A protection circuit in accordance with claim 9 wherein said gate electrode of said MOS transistor is connected to said signal terminal.

11. A protection circuit in accordance with claim 9 wherein said gate electrode of said MOS transistor is connected to said reference terminal.

12. A protection circuit in accordance with claims 9, 10, or 11 further including a utilization circuit for signal connection to said signal terminal.

* * * * *

UNITED STATES PATENT AND TRADEMARK OFFICE
CERTIFICATE OF CORRECTION

PATENT NO. : 4,400,711

DATED : August 23, 1983

INVENTOR(S) : Leslie Ronald Avery

It is certified that error appears in the above-identified patent and that said Letters Patent is hereby corrected as shown below:

Column 2, line 49, "rgions" should be --regions--.

Column 2, line 64, "insulting" should be --insulating--.

Claim 1, line 4, "disclosed" should be --disposed--.

Signed and Sealed this

Twenty-seventh Day of December 1983

[SEAL]

Attest:

GERALD J. MOSSINGHOFF

*Attesting Officer*  *Commissioner of Patents and Trademarks*